United States Patent
Muchiyev et al.

(10) Patent No.: US 11,029,348 B2
(45) Date of Patent: Jun. 8, 2021

(54) MEASURING A LOAD RESISTANCE COUPLED TO A TRANSMISSION LINE

(71) Applicant: Western Digital Technologies, Inc., San Jose, CA (US)

(72) Inventors: Sergey G. Muchiyev, Mountain View, CA (US); Yaw Shing Tang, Saratoga, CA (US); Cliff C. Zhang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 411 days.

(21) Appl. No.: 16/186,207

(22) Filed: Nov. 9, 2018

(65) Prior Publication Data

US 2020/0150166 A1    May 14, 2020

(51) Int. Cl.
*G01R 27/16* (2006.01)
*G11B 5/48* (2006.01)

(52) U.S. Cl.
CPC .......... *G01R 27/16* (2013.01); *G11B 5/48* (2013.01)

(58) Field of Classification Search
CPC .................................. G01R 27/16; G11B 5/48
See application file for complete search history.

(56) References Cited

U.S. PATENT DOCUMENTS

| | | | | |
|---|---|---|---|---|
| 4,408,282 A | * | 10/1983 | Hof | G01N 27/223 324/603 |
| 5,086,781 A | * | 2/1992 | Bookspan | A61B 5/4869 600/547 |
| 9,470,729 B2 | | 10/2016 | Lindqvist et al. | |
| 2004/0080323 A1 | | 4/2004 | Bostoen et al. | |
| 2017/0227596 A1 | * | 8/2017 | Sozer | G01M 5/0058 |

OTHER PUBLICATIONS

Google_Search_Results, Feb. 17, 2021, 2 pp. (Year: 2021).*
Google_Search_Results, Feb. 17, 2021, 1pp. (Year: 2021).*
NPL Search Results, Apr. 13, 2021, 5pp. (year: 2021).*
David M. Pozner, "Microwave Engineering," 2nd Edition, pp. 94-96, New York, Wiley, 1998.

* cited by examiner

*Primary Examiner* — Toan M Le
*Assistant Examiner* — Xiuqin Sun

(57) ABSTRACT

Measurement circuitry is disclosed that is configured to be coupled to a load through a transmission line. A first AC signal having a frequency ω1 is applied to the transmission line and a first input impedance of the transmission line is measured. A second AC signal having a frequency ω2 is applied to the transmission line and a second input impedance of the transmission line is measured, wherein the frequency ω2 is different than the frequency ω1. A third AC signal having a frequency ω is applied to the transmission line and a third input impedance of the transmission line is measured, wherein the frequency ω is different than the frequency ω1 and different than the frequency ω2. A resistance of the load is measured based on the measured first input impedance, the measured second input impedance, and the measured third input impedance.

19 Claims, 5 Drawing Sheets

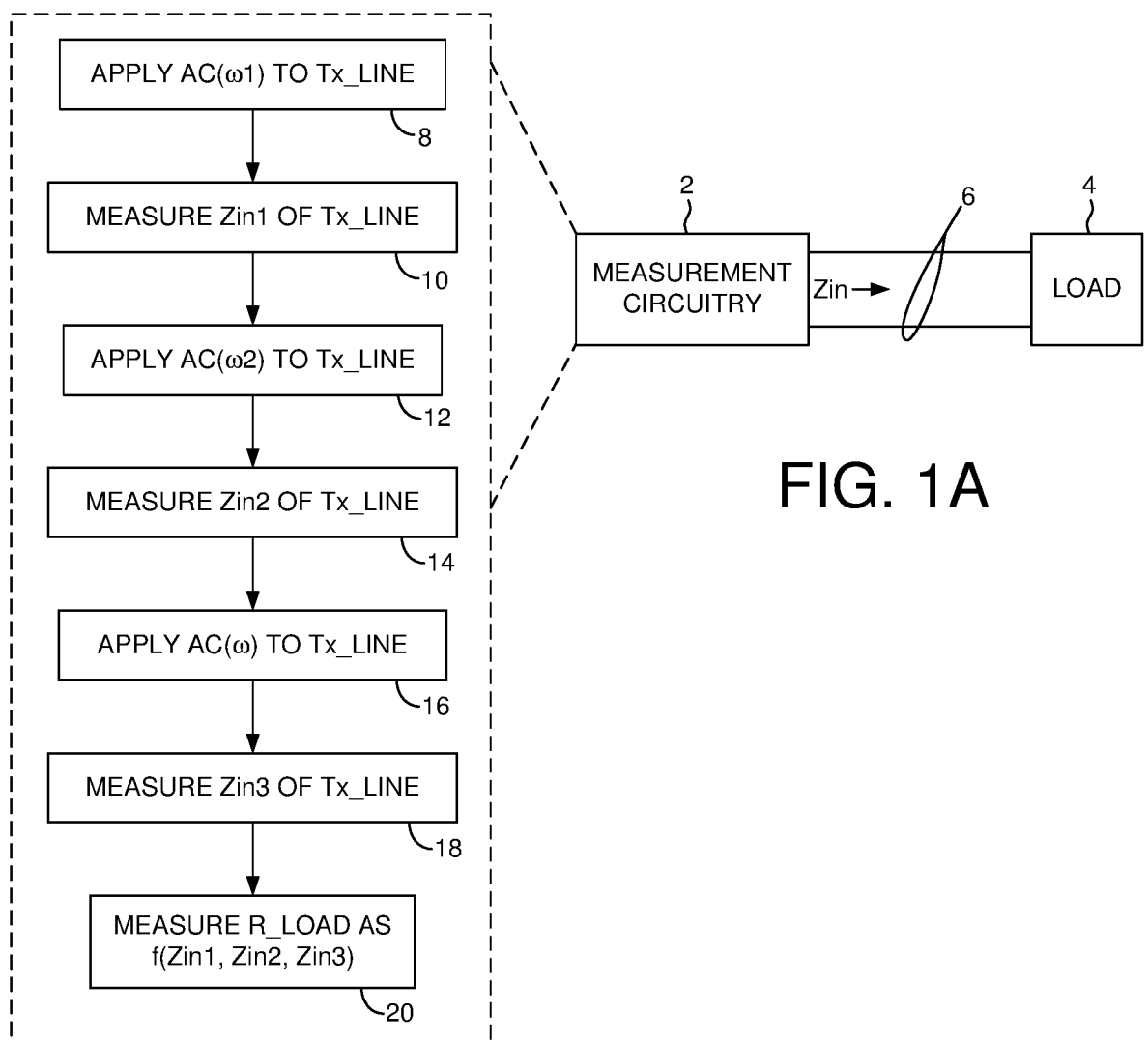

MEASURING A LOAD RESISTANCE COUPLED TO A TRANSMISSION LINE

BACKGROUND

In any number of electronic circuit applications, it may be desirable to measure the resistance of a load at the end of a transmission line. For example, in a disk drive application it may be desirable to measure the resistance of one or more components fabricated within a head (e.g., write element, read element, etc.) which may be connected to a preamp circuit through a transmission line. A conventional technique for measuring the resistance of a load is to apply a DC voltage to the transmission line and measure the resulting combined resistance of the transmission line and load by dividing the DC voltage by the amplitude of the resulting current. However, the unknown and variable resistance of the transmission line (e.g., due to manufacturing tolerances) may obfuscate a simple DC measurement technique, particularly when the resistance of the load is equal to or smaller than the resistance of the transmission line.

BRIEF DESCRIPTION OF THE DRAWINGS

FIG. 1A shows measurement circuitry according to an embodiment configured to be coupled to a load through a transmission line.

FIG. 1B is a flow diagram according to an embodiment wherein a resistance of the load is measured based on a measured input impedance of the transmission line at three frequencies of an AC signal applied to the transmission line.

DETAILED DESCRIPTION

Figure 2A:
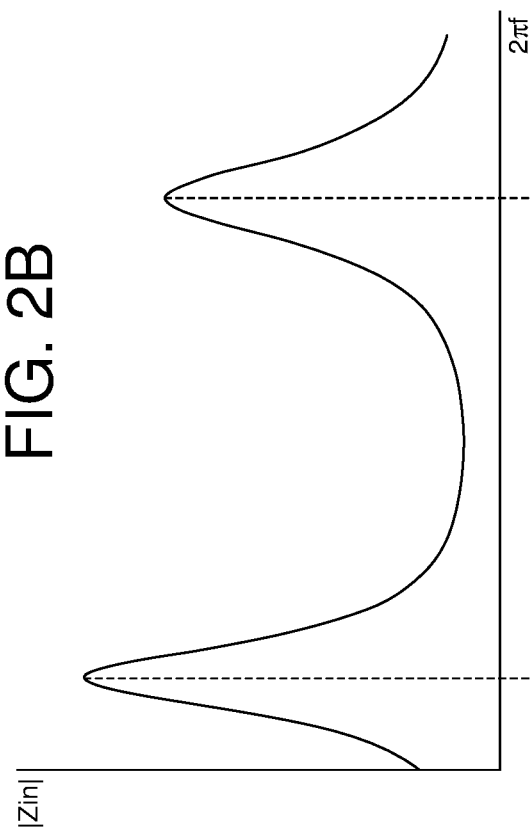
FIGS. 2A and 2B show a phase and amplitude of an input impedance of the transmission line relative to a frequency of an applied AC signal when the transmission line has a first attenuation constant.

FIG. 1A shows measurement circuitry 2 configured to be coupled to a load 4 through a transmission line 6, wherein the measurement circuitry 2 is configured to measure a resistance of the load by executing the flow diagram of FIG. 1B. A first AC signal having a frequency $\omega 1$ is applied to the transmission line (block 8) and a first input impedance of the transmission line is measured (block 10). A second AC signal having a frequency $\omega 2$ is applied to the transmission line (block 12) and a second input impedance of the transmission line is measured (block 14), wherein the frequency $\omega 2$ is different than the frequency $\omega 1$. A third AC signal having a frequency $\omega$ is applied to the transmission line (block 16) and a third input impedance of the transmission line is measured (block 18), wherein the frequency $\omega$ is different than the frequency $\omega 1$ and different than the frequency $\omega 2$. The resistance of the load is measured based on the measured first input impedance, the measured second input impedance, and the measured third input impedance (block 20).

When applying an AC signal to the transmission line 6 at a sufficiently low frequency, an attenuation of the response signal is due mainly to a skin-effect of the transmission line. This attenuation may be represented as an attenuation constant $\alpha$ in the following equation representing an input impedance of the transmission line when connected to the load:

$$Zin = Z0 \frac{1 + \Gamma * E^{2\gamma L}}{1 - \Gamma * E^{2\gamma L}} \tag{1}$$

where:
E represents an exponential function;
L represents a length of the transmission line;

$\gamma = \alpha + j\beta$;

$\alpha$ represents the attenuation constant of the transmission line;
$\beta = 2\pi/\lambda$ represents a propagation constant of the transmission line;
$\lambda$ represents a wavelength of the AC signal applied to the transmission line;

$$\Gamma = \frac{r - Z0}{Z0 + r}; \tag{2}$$

$\Gamma$ represents a reflection coefficient of the transmission line;
Z0 represents a characteristic impedance of the transmission line; and
r represents the resistance of the load.

Accordingly, in one embodiment the resistance of the load r may be measured by estimating the reflection coefficient $\Gamma$ and the characteristic impedance Z0 of the transmission line at any given frequency of the AC signal applied to the transmission line.

When the wavelength of the AC signal is equal to four times the length of the transmission line (referred to as the quarter-wave frequency):

$\lambda = 4L$ then:

$$E^{-j2\beta\frac{\lambda}{4}} = -1$$

and the above impedance equation (1) simplifies to:

$$Zin = Z0 \frac{1 + \Gamma * E^{-2\alpha\frac{\lambda}{4}}}{1 - \Gamma * E^{-2\alpha\frac{\lambda}{4}}} \tag{3}$$

Assuming the attenuation constant α of the transmission line depends on frequency as the square root due mainly to the skin effect of the electro-magnetic wave in conductive copper traces, then:

$$\alpha = \frac{1}{2Z0*W} * \sqrt{\frac{\omega*\mu}{2\sigma}} \quad (4)$$

where W represents the width of the transmission line, and μ represents a permeability of a copper transmission line. The above equations mean there are multiple resonances in the imaginary part of the attenuation factor S of the above impedance equation (1):

$$S = E^{2\gamma l}$$

For example, resonances in the imaginary part of the attenuation factor S occur at the frequencies:

$$\omega*\tfrac{1}{2} \text{ and } \omega*3/2$$

where ω represents the quarter-wave frequency of the transmission line. At the above resonance frequencies, the real part of the attenuation factor S is zero and the above impedance equation (1) for the three frequencies simplifies to:

| $\omega$ | $\omega*\frac{1}{2}$ | $\omega*\frac{3}{2}$ |
|---|---|---|
| $Zin = Z0\frac{1-\Gamma S}{1+\Gamma S}$ | $Z'in = Z0'\frac{1-\Gamma S'}{1+\Gamma S'}$ | $Z''in = Z0''\frac{1+\Gamma S''}{1-\Gamma S''}$ |
| | $\Gamma S' = -\tan\left(\frac{\psi}{2}\right)$ | $\Gamma S'' = \tan\left(\frac{\psi}{2}\right)$ |
| | $Z0' = |Z'in|$ | $Z0'' = |Z''in|$ |

In the above table, ψ represents the phase of the input impedance at the above resonance frequencies for attenuation factor S. Accordingly the terms ΓS' and ΓS'' may be determined by measuring the phase of the input impedance at each resonance frequency ω*½ and ω*3/2. Assuming the reflection coefficient Γ is substantially equal at the two resonance frequencies, then:

$$\frac{-\Gamma S'}{\Gamma S''} = \frac{-S'}{S''} => \frac{|S'|}{|S''|} = \frac{S^{1/\sqrt{2}}}{S^{\sqrt{3}/\sqrt{2}}} => S = \left(\frac{S'}{S''}\right)^{\frac{\sqrt{2}}{(1-\sqrt{3})}}$$

At each resonance frequency ω*½ and ω*3/2 the ratio of the input impedance equations in the above table is a ratio of conjugate complex numbers, and therefore the characteristic impedance Z0 at each resonance frequency is equal to the magnitude of the measured input impedance |Zin| at each resonance frequency. In one embodiment, the characteristic impedance Z0(ω) at the quarter-wave frequency ω may be estimated through linear interpolation of the measured characteristic impedance at the two resonance frequencies Z0(ω*½) and Z0(ω*3/2). The reflection coefficient Γ may then be estimated based on the input impedance equation in the above table at the quarter-wave frequency:

$$\Gamma = \frac{Z0(\omega) - Zin(\omega)}{S(\omega)*(Zin(\omega) + Z0(\omega))} \quad (5)$$

By substituting the reflection coefficient of equation (5) into the above equation (2), the load resistance may be measured as:

$$r = Z0(\omega)\left[\frac{Z0(\omega)(S(\omega)+1) + Zin(\omega)(S(\omega)-1)}{Zin(S(\omega)+1) + Z0(\omega)(S(\omega)-1)}\right]$$

Figure 2B:
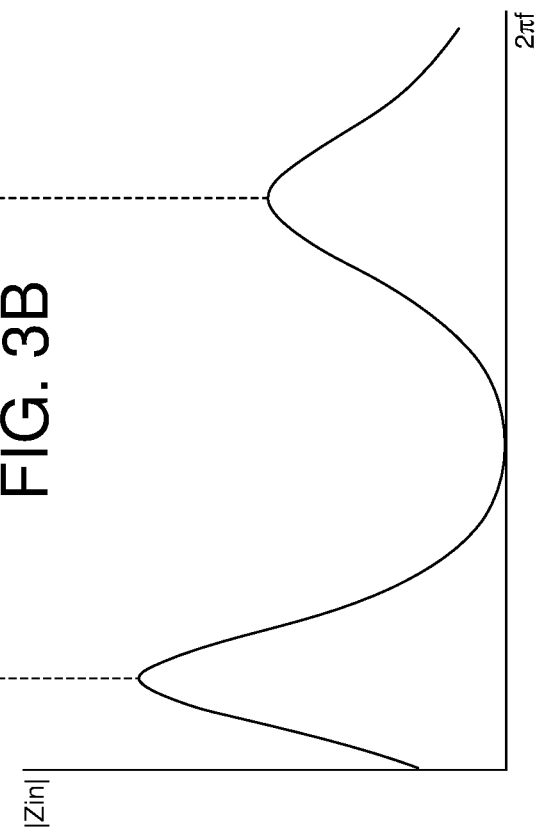
Figure 3A:
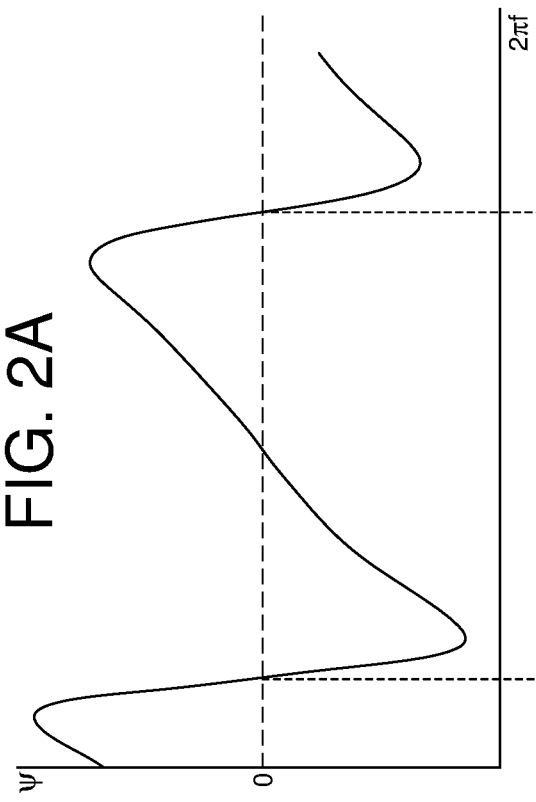
FIGS. 3A and 3B show a phase and amplitude of an input impedance of the transmission line relative to a frequency of an applied AC signal when the transmission line has a second attenuation constant.
Figure 3B:
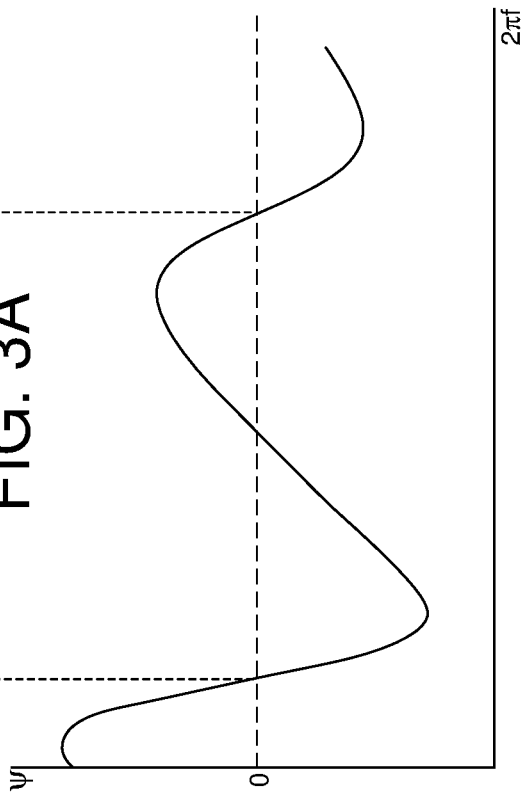

FIGS. 2A and 2B show a phase and amplitude of an input impedance of the transmission line relative to the frequency of the applied AC signal when the transmission line has a first attenuation constant α, and FIGS. 2C and 2D show a phase and amplitude of an input impedance of the transmission line when the transmission line has a second attenuation constant α. At the quarter-wave frequency ω, the input impedance of the transmission line may be estimated by:

$$Zin(\omega) = \frac{Z0(\omega)^2}{(r + \alpha*L*Z0(\omega))}$$

The above three frequency technique for measuring the load resistance effectively accounts for variation of the attenuation constant α across different transmission lines. FIGS. 2A and 2B also illustrate how a quarter-wave resonance occurs at other frequencies, and in general when a wavelength of the AC signal is equal to:

$$\frac{4L}{1+2n}$$

where n is an integer. In addition, the resonances of the attenuation factor S also occur at different frequencies relative to the quarter-wave resonance frequencies of the input impedance (i.e., at different integer values for n):

$$\omega 1_n = \omega_n \frac{1+4n}{2+4n} \text{ and } \omega 2_n = \omega_n \frac{3+4n}{2+4n}$$

where at each of these resonance frequencies the characteristic impedance Z0 equals the magnitude of the measured input impedance |Zin|. Accordingly the above three frequency technique for measuring the attenuation factor at any of the quarter-wave resonance frequencies of the input impedance may be generalized to:

$$S(\omega) = \left[\frac{S(\omega 1)}{S(\omega 2)}\right]^p \text{ where } p = \frac{\sqrt{(2+4n)}}{\left(\sqrt{1+4n} - \sqrt{3+4n}\right)}$$

as derived from the above equation (4).

The following derivation shows why at the resonance frequencies ω*½ and ω*3/2 the attenuation factor S is a pure imaginary value (the real value is zero). At the resonance frequency ω*3/2

$$j\Gamma S'' = \frac{Z0 - \text{Re}[Zin] - j\text{Im}[Zin]}{Z0 + \text{Re}[Zin] + j\text{Im}[Zin]} =$$

$$\frac{(\text{Re}[Zin])^2 + (\text{Im}[Zin])^2 - Z0^2}{(\text{Re}[Zin])^2 + (\text{Im}[Zin])^2 + Z0^2 + 2Z0*\text{Re}[Zin]} +$$

-continued $$j\frac{2*Z0*\text{Im}[Zin]}{(\text{Re}[Zin])^2 + (\text{Im}[Zin])^2 + Z0^2 + 2Z0*\text{Re}[Zin]}$$

Since $$(\text{Re}[Zin])^2 + (Im[Zin])^2 - Z0^2 = 0$$

then $$j\Gamma S'' = j\frac{\text{Im}[Zin]}{Z0 + \text{Re}[Zin]}$$

Representing Zin as phasor with phase ψ, then:

$$\Gamma S'' = \frac{\text{Abs}(Zin)*\sin\psi}{\text{Abs}(Zin) + \text{Abs}(Zin)*\cos\psi} = \tan\left(\frac{\psi}{2}\right)$$

At the resonance frequency ω*½, the imaginary part of the input impedance changes polarity such that:

$$\Gamma S' = -\tan\left(\frac{\psi}{2}\right)$$

Figure 4:
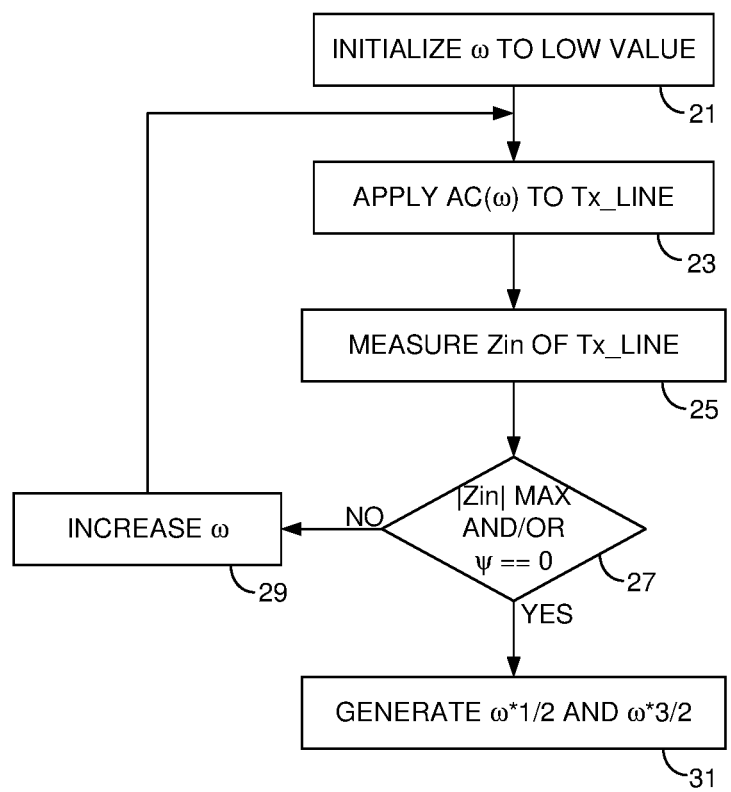
FIG. 4 is a flow diagram according to an embodiment wherein a quarter-wave frequency of the AC signal is calibrated by adjusting a frequency of the AC signal until the measured magnitude of the input impedance reaches a maximum and/or until the measured phase of the input impedance reaches zero.

FIG. 4 is a flow diagram according to an embodiment for calibrating the quarter-wave frequency ω of the transmission line as well as the resonance frequencies ω*½ and ω*3/2 of the attenuation factor S. In this embodiment, the frequency of the AC signal is initialized to a low value known to be lower than the quarter-wave frequency (block 21). The AC signal is applied to the transmission line (block 23) and the resulting input impedance is measured (block 25). The frequency of the AC signal is then increased (block 29) until the magnitude of the measured input impedance reaches a maximum and/or the phase of the measured input impedance reaches zero (block 27). That is, the quarter-wave frequency ω occurs when the measured input impedance magnitude reaches a maximum or the phase reaches zero such as shown in FIGS. 2A and 2B. The resonance frequencies ω*½ and ω*3/2 of the attenuation factor S may then be configured (block 31) based on the calibrated quarter-wave frequency ω.

Figure 5:
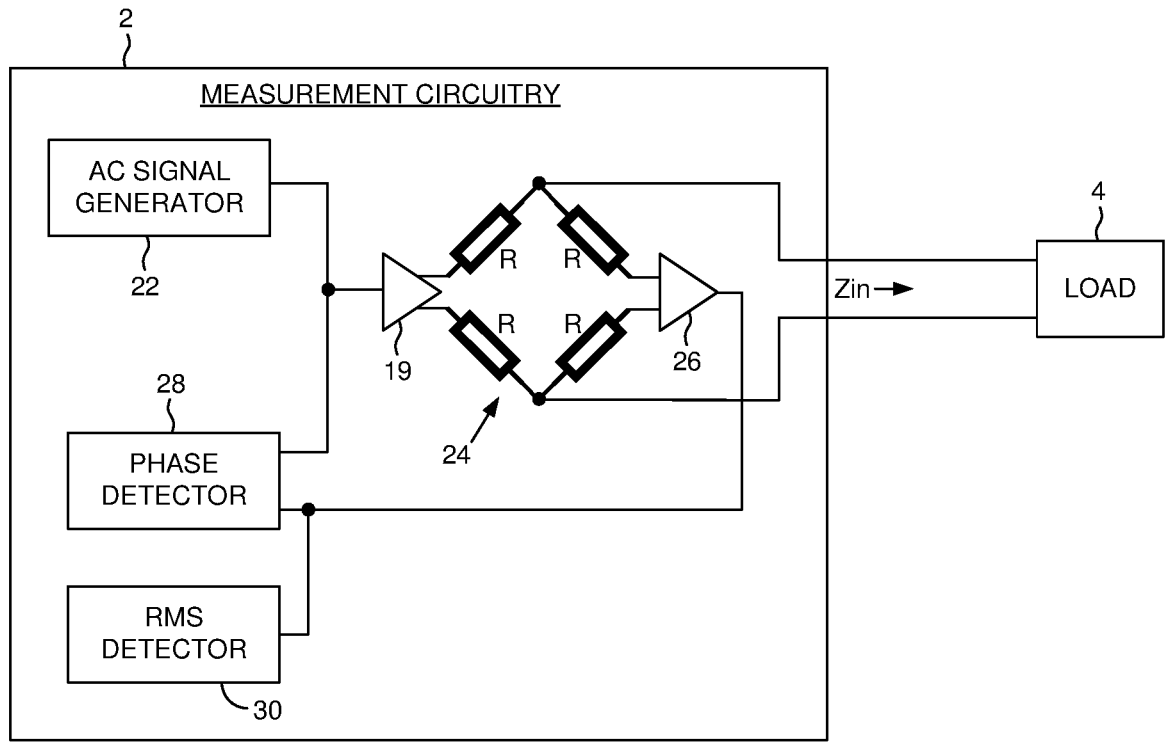
FIG. 5 shows an embodiment wherein the measurement circuitry comprises a resistor bridge configured to couple to the transmission line.
Figure 6:
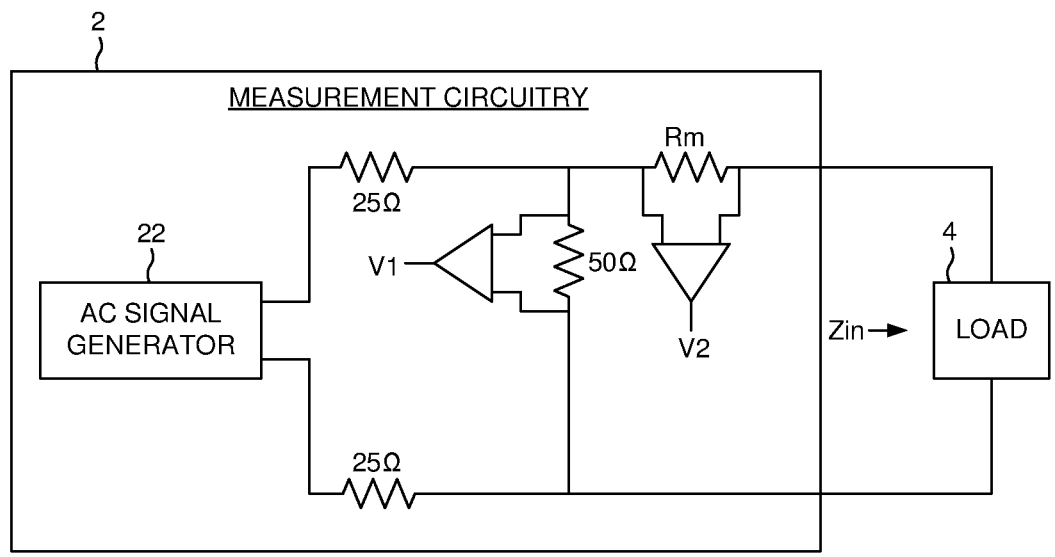
FIG. 6 shows an embodiment wherein the measurement circuitry comprises a RF-IV circuit configured to couple to the transmission line.

Any suitable circuitry may be employed in the above three frequency technique in order to measure the input impedance (magnitude and phase) when calibrating the quarter-wave frequency, as well as when measuring the resistance of the load as described above. FIG. 5 shows an embodiment wherein the measurement circuitry 2 comprises a suitable AC signal generator 22 for generating an AC signal in the form of a sinusoidal voltage at the quarter-wave and resonance frequencies described above. The AC signal is applied to the transmission line and load 4 through an amplifier 19 driving a resistor bridge 24, wherein a current flowing through the transmission line and load 4 is measured at amplifier 26. In one embodiment, the output impedance of amplifier 23 and the input impedance of amplifier 26 are significantly smaller than each resistor R of the resistor bridge 24. A suitable phase detector 28 detects a phase of the current flowing through the transmission line relative to the phase of the AC signal, thereby measuring the phase of the input impedance Zin. A suitable root-mean-square (RMS) detector 30 measures a magnitude of the current, thereby measuring a magnitude of the input impedance Zin. When measuring the input impedance at the quarter-wave resonance frequency, the phase of the input impedance is substantially zero as shown in FIG. 2A such that in one embodiment only the magnitude need be measured using the RMS detector 30. FIG. 6 shows an alternative embodiment for the measurement circuitry 2 configured to measure the input impedance Zin. This embodiment employs a RF-IV circuit wherein the input impedance Zin is measured based on:

$$\frac{V2}{V1} = \frac{Rm}{Rm + Zin}$$

where Rm represents a suitable current-measurement resistor and the voltages V1 and V2 are generated as phasors.

Figure 7A:
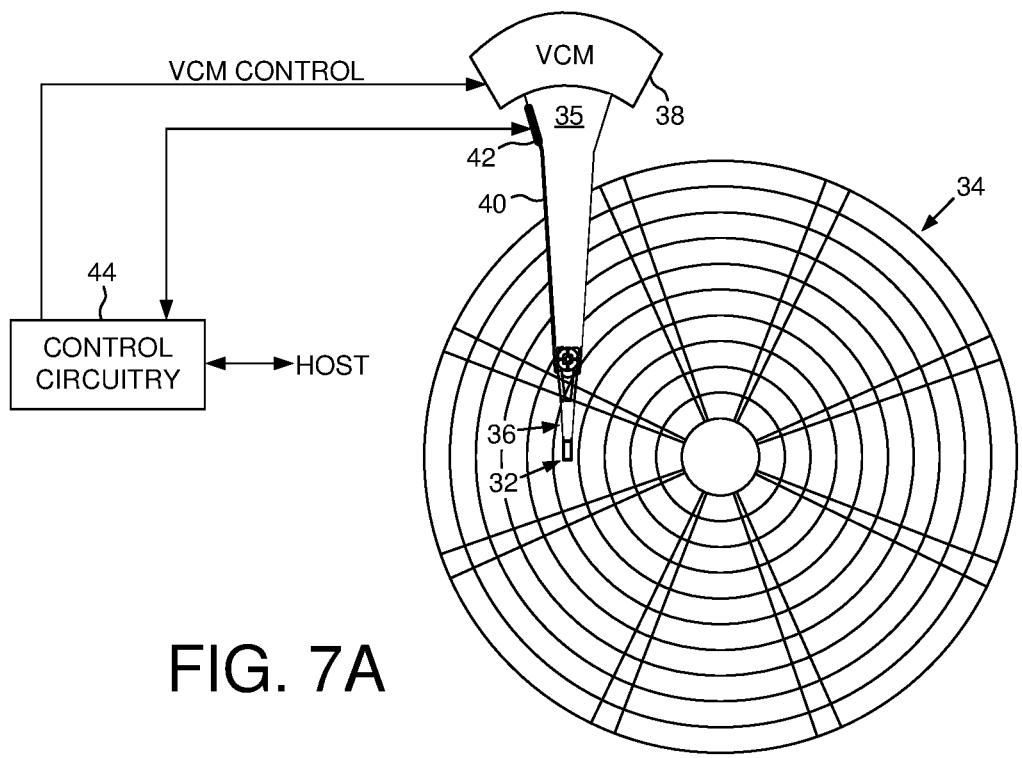
FIGS. 7A and 7B show a data storage device according to an embodiment in the form of a disk drive comprising a head actuated over a disk, wherein a resistance of at least one component of the head may be measured.
Figure 7B:
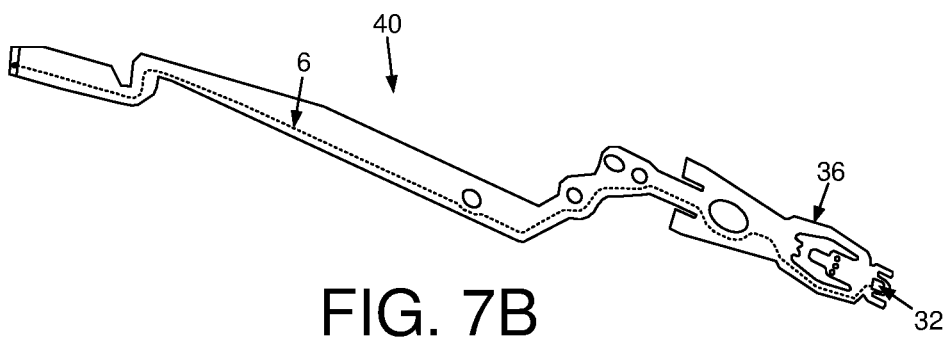

The embodiments described above may be used to measure the resistance of any suitable loaded 6 coupled to the end of any suitable transmission line. FIGS. 7A and 7B show a data storage device according to an embodiment in the form of a disk drive comprising a head 32 actuated over a disk 34. The head 32 is coupled to a distal end of an actuator arm 35 through a suspension 36 that biases the head 32 toward the surface of the disk 34. A voice coil motor (VCM) 38 rotates the actuator arm 35 about a pivot in order to position the head 32 over the disk during access operations (write/read operations). An interconnect 40 couples the head 32 to a suitable preamp circuit 42, wherein the interconnect comprises at least one transmission line 6 for coupling a component of the head 32 to the preamp 42. The disk drive further comprises control circuitry 44 configured to carry out various operations of the disk drive, such as servoing the VCM 38 to position the head 32 over the disk 34 during access operations, including write/read operations received from a host.

In one embodiment, it may be desirable to measure a resistance of at least one component of the head 32, such as the resistance of a write element configured to write data to the disk or the resistance of a read element configured to read data from the disk. In one embodiment, one or more components of the measurement circuitry 2 such as shown in FIG. 5 or FIG. 6 may be implemented within the preamp 42 of a disk drive, and/or one or more of the components of the measurement circuitry 2 may be implemented within the control circuitry 44 of the disk drive. In one embodiment, the control circuitry 44 may configure measurement circuitry 2 within the preamp 42, such as configuring the frequency of the AC signal generator 22. In another embodiment, the control circuitry 44 may access registers of the preamp 42, for example, to read the measured phase and magnitude generated by the phase detector 28 and RMS detector 30 in the embodiment of FIG. 5, or to read the measured voltage phasors in the embodiment of FIG. 6. The control circuitry 44 may then process the resulting measurements as described above in order to measure the resistance of the target component.

In one embodiment, a suitable test station (e.g., a suitable spin stand) may be employed to measure the resistance of at least one of the head components using the above described embodiments. In one embodiment, the transmission line 6 may be coupled to the test station, wherein the test station may comprise the measurement circuitry 2 such as shown in FIG. 5 or FIG. 6. In another embodiment, the test station may be coupled to the preamp 42, wherein the preamp 2 may comprise at least some of the components of the measurement circuitry 2 used to measure the resistance of the load coupled to the end of the transmission line 6. In yet another embodiment, the test station may configure the measurement circuitry 2 within the preamp 42, such as configuring the frequency of the AC signal generator 22, and/or the test station may access registers in the preamp 42 in order to read the measurement results, such as the measured phase and magnitude generated by the phase detector 28 and RMS detector 30 in the embodiment of FIG. 5, or to read the measured voltage phasors in the embodiment of FIG. 6. The test station may then process the resulting measurements as described above in order to measure the resistance of the target component.

Any suitable AC signal may be employed in the embodiments described above. In the embodiments of FIG. 5 and FIG. 6, the AC signal may be generated as a sinusoidal voltage having a target frequency, wherein the measured signal represents a current flowing through the transmission line and load. In other embodiments, the AC signal may be generated as a current having a target frequency, wherein the measured signal may represent a voltage across the transmission line and load.

Any suitable control circuitry may be employed to implement the flow diagrams in the above embodiments, such as any suitable integrated circuit or circuits. For example, in the disk drive embodiment, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry. In some embodiments, at least some of the flow diagram blocks may be implemented using analog circuitry (e.g., analog comparators, timers, etc.), and in other embodiments at least some of the blocks may be implemented using digital circuitry or a combination of analog/digital circuitry.

In various embodiments, a disk drive may include a magnetic disk drive, an optical disk drive, a hybrid disk drive, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. Measurement circuitry configured to be coupled to a load through a transmission line, wherein the measurement circuitry is configured to:
    apply a first AC signal having a frequency $\omega 1$ to the transmission line and measure a first input impedance of the transmission line;
    apply a second AC signal having a frequency $\omega 2$ to the transmission line and measure a second input impedance of the transmission line, wherein the frequency $\omega 2$ is different than the frequency $\omega 1$;
    apply a third AC signal having a frequency $\omega$ to the transmission line and measure a third input impedance of the transmission line, wherein the frequency $\omega$ is different than the frequency $\omega 1$ and different than the frequency $\omega 2$; and
    measure a resistance of the load based on the measured first input impedance, the measured second input impedance, and the measured third input impedance,
    wherein the frequency $\omega$ of the third AC signal is a quarter-wave resonance frequency of the transmission line such that a wavelength of the third AC signal is substantially equal to:

$$\frac{4L}{1+2n}$$

where:
L represents a length of the transmission line; and
n is an integer.

2. The measurement circuitry as recited in claim 1, wherein n is zero such that a frequency of the third AC signal is a quarter-wave frequency.

3. The measurement circuitry as recited in claim 2, wherein:
    the frequency $\omega 1$ is half of the frequency $\omega$; and
    the frequency $\omega 2$ is 3/2 of the frequency $\omega$.

4. The measurement circuitry as recited in claim 3, wherein the measurement circuitry is further configured to calibrate the third frequency $\omega$ by:

while applying a calibration AC signal to the transmission line, adjusting a frequency of the calibration AC signal;
measuring a calibration input impedance of the transmission line at a plurality of the frequencies of the calibration AC signal; and
selecting the third frequency ω based on at least one of:
when a magnitude the calibration input impedance is near a maximum; or
when a phase of the calibration input impedance is near zero.

5. The measurement circuitry as recited in claim 2, wherein:
the frequency ω1 of the first AC signal corresponds to an attenuation factor S(ω1) of the transmission line having a substantially zero real value; and
the frequency ω2 of the second AC signal corresponds to an attenuation factor S(ω2) of the transmission line having a substantially zero real value.

6. The measurement circuitry as recited in claim 5, wherein the measurement circuitry is further configured to:
measure a first value ΓS(ω1) of the transmission line at the frequency ω1 based on a first phase of the first input impedance, and measure a second value ΓS(ω2) for the transmission line at the frequency ω2 based on a second phase of the second input impedance, where Γ represents a reflection factor of the transmission line;
measure an attenuation factor S(ω) of the transmission line at the frequency ω based on a ratio of the measured first value ΓS(ω1) and the measured second value ΓS(ω2); and
measure the resistance of the load based on the measured attenuation factor S(ω).

7. The measurement circuitry as recited in claim 6, wherein the measurement circuitry is further configured to:
generate a characteristic impedance of the transmission line at the frequency ω based on the first measured input impedance and the second measured input impedance; and
measure the resistance of the load based on:
the measured attenuation factor S(ω) of the transmission line at the frequency ω;
the generated characteristic impedance of the transmission line at the frequency ω; and
the measured third input impedance of the transmission line at the frequency ω.

8. The measurement circuitry as recited in claim 7, wherein the measurement circuitry is further configured to measure the resistance of the load based on:

$$Z0(\omega) = \left[ \frac{Z0(\omega)(S(\omega)+1) + Zin(\omega)(S(\omega)-1)}{Zin(S(\omega)+1) + Z0(\omega)(S(\omega)-1)} \right]$$

where Z0(ω) represents the characteristic impedance of the transmission line at the frequency ω, and Zin(ω) represents the measured third input impedance of the transmission line at the frequency ω.

9. The measurement circuitry as recited in claim 1, further comprising a resistor bridge configured to couple to the transmission line.

10. The measurement circuitry as recited in claim 1, further comprising a RF-IV circuit configured to couple to the transmission line.

11. The measurement circuitry as recited in claim 1, wherein the load comprises a component of a head in a data storage device.

12. A method of measuring a resistance of a load coupled through a transmission line to measurement circuitry, the method comprising:
applying a first AC signal having a frequency ω1 to the transmission line and measuring a first input impedance of the transmission line;
applying a second AC signal having a frequency ω2 to the transmission line and measuring a second input impedance of the transmission line, wherein the frequency ω2 is different than the frequency ω1;
applying a third AC signal having a frequency ω to the transmission line and measuring a third input impedance of the transmission line, wherein the frequency ω is different than the frequency ω1 and different than the frequency ω2;
processing the first input impedance and the second input impedance to measure a ratio:

$$S(\omega) = \left[ \frac{S(\omega 1)}{S(\omega 2)} \right]^p \text{ where } p = \frac{\sqrt{(2+4n)}}{\left( \sqrt{1+4n} - \sqrt{3+4n} \right)}$$

S(ω1) represents an attenuation factor of the transmission line at the frequency ω1, S(ω2) represents an attenuation factor of the transmission line at the frequency ω2, S(ω) represents an attenuation factor of the transmission line at the frequency ω, and n is an integer; and
measuring a resistance of the load based on and the measured third input impedance and the attenuation factor S(ω).

13. The method as recited in claim 12, wherein the frequency ω of the third AC signal is a quarter-wave resonance frequency of the transmission line such that a wavelength of the third AC signal is substantially equal to:

$$\frac{4L}{1+2n}$$

where:
L represents a length of the transmission line; and
n is an integer.

14. The method as recited in claim 13, wherein n is zero such that a frequency of the third AC signal is a quarter-wave frequency.

15. The method as recited in claim 14, wherein:
the frequency ω1 of the first AC signal corresponds to the attenuation factor S(ω1) of the transmission line having a substantially zero real value; and
the frequency ω2 of the second AC signal corresponds to the attenuation factor S(ω2) of the transmission line having a substantially zero real value.

16. The method as recited in claim 15, further comprising:
generating a characteristic impedance of the transmission line at the frequency ω based on the first measured input impedance and the second measured input impedance; and
measuring the resistance of the load based on:
the measured attenuation factor S(ω) of the transmission line at the frequency ω;
the generated characteristic impedance of the transmission line at the frequency ω; and
the measured third input impedance of the transmission line at the frequency ω.

17. The method as recited in claim 16, further comprising measuring the resistance of the load based on:

$$Z0(\omega) = \left[\frac{Z0(\omega)(S(\omega)+1) + Zin(\omega)(S(\omega)-1)}{Zin(S(\omega)+1) + Z0(\omega)(S(\omega)-1)}\right]$$

where $Z0(\omega)$ represents the characteristic impedance of the transmission line at the frequency $\omega$, and $Zin(\omega)$ represents the measured third input impedance of the transmission line at the frequency $\omega$.

18. The method as recited in claim 14, wherein:
the frequency $\omega 1$ is half of the frequency $\omega$; and
the frequency $\omega 2$ is 3/2 of the frequency $\omega$.

19. The method as recited in claim 18, further comprising calibrating the third frequency $\omega$ by:
- while applying a calibration AC signal to the transmission line, adjusting a frequency of the calibration AC signal;
- measuring a calibration input impedance of the transmission line at a plurality of the frequencies of the calibration AC signal; and
- selecting the third frequency $\omega$ based on at least one of:
  - when a magnitude the calibration input impedance is near a maximum; or
  - when a phase of the calibration input impedance is near zero.

* * * * *